United States Patent
Hoppe et al.

(10) Patent No.: US 9,447,490 B2
(45) Date of Patent: Sep. 20, 2016

(54) PISTON RING

(75) Inventors: Steffen Hoppe, Overath (DE); Manfred Fischer, Leichlingen (DE); Christiane Bauer, Burscheid (DE); Ralf Lammers, Wermelskirchen (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 1063 days.

(21) Appl. No.: 12/671,100

(22) PCT Filed: Jul. 18, 2008

(86) PCT No.: PCT/EP2008/059473
§ 371 (c)(1),
(2), (4) Date: Jan. 28, 2010

(87) PCT Pub. No.: WO2009/016051
PCT Pub. Date: Feb. 5, 2009

(65) Prior Publication Data
US 2010/0187765 A1 Jul. 29, 2010

(30) Foreign Application Priority Data
Jul. 28, 2007 (DE) .................. 10 2007 035 502

(51) Int. Cl.
B32B 9/00 (2006.01)
C23C 14/06 (2006.01)
C23C 4/10 (2016.01)
C23C 30/00 (2006.01)
C23C 28/04 (2006.01)

(52) U.S. Cl.
CPC ............ *C23C 14/0641* (2013.01); *C23C 4/10* (2013.01); *C23C 28/044* (2013.01); *C23C 28/048* (2013.01); *C23C 30/00* (2013.01)

(58) Field of Classification Search
USPC ......... 277/442, 443, 444; 428/216, 697, 698
See application file for complete search history.

(56) References Cited

U.S. PATENT DOCUMENTS

| | | | | |
|---|---|---|---|---|
| 4,681,817 A * | 7/1987 | Shinada | | 277/442 |
| 5,104,132 A * | 4/1992 | Onoda et al. | | 277/443 |
| 5,154,433 A * | 10/1992 | Naruse | | 277/443 |
| 5,549,086 A | 8/1996 | Ozawa et al. | | |
| 6,022,175 A * | 2/2000 | Heinrich et al. | | 407/119 |
| 6,110,329 A | 8/2000 | Holleck et al. | | |
| 6,232,003 B1 | 5/2001 | Ogawa et al. | | |
| 6,395,108 B2 * | 5/2002 | Eberle et al. | | 148/330 |
| 6,503,642 B1 | 1/2003 | Linde | | |
| 6,656,293 B2 * | 12/2003 | Black et al. | | 148/219 |
| 6,811,580 B1 * | 11/2004 | Littecke | | 51/307 |
| 7,793,940 B2 * | 9/2010 | Martin | | 277/370 |
| 7,871,078 B2 * | 1/2011 | Fischer et al. | | 277/442 |
| 7,879,443 B2 * | 2/2011 | Endrino | | 428/408 |
| 7,960,016 B2 * | 6/2011 | Lechthaler et al. | | 428/217 |
| 8,007,922 B2 * | 8/2011 | Mirchandani et al. | | 428/548 |
| 2002/0168552 A1 | 11/2002 | Yamamoto et al. | | |
| 2005/0170162 A1 | 8/2005 | Yamamoto et al. | | |
| 2005/0218603 A1 * | 10/2005 | Fischer | | 277/443 |
| 2006/0024140 A1 * | 2/2006 | Wolff et al. | | 408/1 R |
| 2006/0269788 A1 | 11/2006 | Ishikawa | | |
| 2008/0095939 A1 | 4/2008 | Fischer et al. | | |
| 2010/0044969 A1 | 2/2010 | Fischer et al. | | |
| 2012/0052326 A1 * | 3/2012 | Kobayashi et al. | | 428/697 |
| 2012/0126488 A1 * | 5/2012 | Avelar Ara jo | | 277/443 |

FOREIGN PATENT DOCUMENTS

| | | |
|---|---|---|
| DE | 3509572 C1 | 7/1986 |
| DE | 3714240 C1 | 7/1988 |
| DE | 69014197 T2 | 3/1995 |
| DE | 19931829 A1 | 1/2001 |
| DE | 10011917 A1 | 9/2001 |
| DE | 10014515 A1 | 10/2001 |
| DE | 102005004402 A1 | 8/2005 |
| DE | 102004028486 A1 | 12/2005 |
| DE | 102004032403 B3 | 12/2005 |
| DE | 102004032342 B4 | 6/2006 |
| EP | 289173 A1 | 11/1988 |
| EP | 645463 A2 | 3/1995 |
| EP | 709483 A2 | 5/1996 |
| EP | 912774 B1 | 8/2002 |
| EP | 1382709 A1 | 1/2004 |
| EP | 1726686 A1 | 11/2006 |
| JP | S63140066 A | 6/1988 |
| JP | H03136846 A | 6/1991 |
| JP | H11335813 A | 12/1999 |
| JP | 2000144376 A | 5/2000 |
| JP | 2001329360 A | 11/2001 |
| JP | 2001335878 | 12/2001 |
| JP | 2004010923 A | 1/2004 |
| JP | 2005060810 | 3/2005 |
| JP | 2006037212 | 2/2006 |
| WO | WO 2004/059030 A2 | 7/2004 |
| WO | 2005100631 A1 | 10/2005 |
| WO | WO 2006/084404 A1 | 8/2006 |
| WO | 2008040695 A2 | 4/2008 |

OTHER PUBLICATIONS

Tien et al: "Oxidation Behavior of Sputtered CrN/A1N Multilayer Coatings During Heat Treatment" Surface and Coatings Technology, Elsevier, Amsterdam, NL., vol. 201, No. 9-11.
Tien et al: "Oxidation Behavior of Sputtered CrN/A1N Multilayer Coatings During Heat Treatment" Surface and Coatings Technology, Elsevier, Amsterdam, NL., vol. 201, No. 9-11, Jan. 31, 2007, pp. 5138-5142, XP005738621 ISSN: 0257-8972, p. 5141, right-hand column, fig. 4.
Miyai Seichi et al., Thermal Properties of DLC Film, Abstract, vol. 26, 2005.
About DIAMONEX Technology—Diamond-like (DLC) Coatings: Amorphous Diamond, Morgan Advanced Ceramics.

* cited by examiner

*Primary Examiner* — Kristina Fulton
*Assistant Examiner* — Eugene G Byrd
(74) *Attorney, Agent, or Firm* — Robert L Stearns; Dickinson Wright, PLLC

(57) ABSTRACT

In order to avoid burn traces on piston rings, it is proposed to provide the piston ring with a wear-protection coating which consists of a material with a thermal conductivity of at least 180 W/(m·K). At least 5% vol. of the wear-protection coating consists of aluminum nitride.

23 Claims, No Drawings

PISTON RING

BACKGROUND OF THE INVENTION

1. Technical Field

The invention concerns a piston ring.

2. Related Art

Piston rings are provided with wear-protection coatings on the bearing surface and/or on the ring sides to be able to meet the required service life. Higher cylinder pressures, direct fuel injection, exhaust gas return, and other structural features of new engine development, such as alternative cylinder materials as well as minimizing oil consumption, are increasingly burdening piston rings.

Wear-protection coatings are applied by means of thermal spray processes, galvanic methods, or thin-layer technology and, if need be, are treated by heat treatment and diffusion processes. The coatings are as a rule largely homogeneous and thus are applied unstructured. The wear resistance is adjusted by means of matching hardness of the material.

All manifestations that indicate thermal overstressing at the piston-ring surface are typically lumped together under the term of "burn traces".

The term "burn traces" was originally defined by manifestations on the running surface of piston rings. Discoloration and so-called "cobblestone formation" on the chromed surface are evidence of thermal overload. If the term "burn traces" is also extended to other materials, then all manifestations that refer to thermal overstressing on the piston-ring surfaces are to be included in it. The differences between burn traces and scoring are not clear. Severe grooving and/or material transfer on the surface of piston rings is known as scoring. Burn traces and scoring are caused by metal contact of the co-operating component, which occurs due to a lack of lubrication oil or too high a pressure per unit area on the piston rings. Leaking piston rings not adjacent to the cylinder wall and out-of-round cylinders facilitate the undesirable passage of hot fuel gases (blow-by loss), whereby the lubrication oil is burned up and metal contact of the co-operating component occurs (see www.motorlexikon,de).

A galvanic hard-chrome coating is known from DE 199 31 829 A1, in which diamond particles with a size of 0.25 to 0.5 µm are embedded. Additionally, then, even hard particles of material made up of tungsten carbide, chromium carbide, aluminum oxide, silicon carbide, silicon nitride, boron carbide, or boron nitride can be embedded in the cracks.

At higher temperatures, the diamond particles are converted to graphite, which then assumes the task of lubrication task and thereby prevents the formation of burn traces. Consequently, this coating also has very good emergency running-mode properties, particularly due to the conversion of diamond to graphite at temperatures of about 700° C. or higher.

In order to further improve the burn-trace behavior of piston rings, coatings up to now have typically been used made out of materials that have very high melting points and for the thermal overstressing of which, as a result of high temperatures, they are required. A typical example of this is chromium nitride applied by means of a physical vapor deposition (PVD) process with a decomposition temperature of approximately 2000° K.

In order to improve the resistance to burn traces and wear resistance, a coating is proposed in DE 10 2004 028 486 A1 of several individual layers, which consists alternately of chromium and chromium nitride. The chromium nitride layers can be of CrN, $Cr_2N$, or mixtures thereof. To avoid a sudden transition, the coating process is controlled so that the individual chromium-nitride layers exhibit on both sides an edge of $Cr_2N$ and a core of CrN. Each individual layer is at least 0.01 µm thick. The maximum thickness is 10 µm. The total thickness of the coating offered is 5 to 100 µm.

The U.S. Pat. No. 5,549,086 discloses piston-ring coatings of TiN and CrN.

The German patent DE 10 2004 032 403 B3 describes piston rings which exhibit at a chromium adhesive layer a CrN gradient layer with a nitrogen content increasing outward.

Piston rings for internal combustion engines are known from the Japanese patent JP 2005-060810 A which are provided with a multilayer coating system, the individual layers of which themselves exhibit metal components and differ merely in nitrogen content. Coating thicknesses of the individual layers are offered at <1 µm. The coatings are applied by means of a PVD process, especially an electric arc process.

The burn-trace resistance of known coatings is not satisfactory however.

SUMMARY OF THE INVENTION

It is therefore the aim of the invention to provide a piston ring with a wear-protection coating, which exhibits greater wear resistance as well as good resistance to burn traces.

It has been emphasized that burn traces, then, can be avoided if heat is removed as quickly as possible. No, or only a few, burn traces occur if a material is used whose thermal conductivity is at least 180 W/(m·K).

DETAILED DESCRIPTION

Preferably, the wear-protection coating is made of aluminum nitride with a proportion of at least $5\%_{vol}$. Further preferred proportions are at least $10\%_{vol}$, at least $20\%_{vol}$, at least $30\%_{vol}$, in particular at least $40\%_{vol}$, and especially preferably at least $50\%_{vol}$. The percentage by volume of the portion applies to the total wear-protection coating, independently of whether it is made up of a homogeneous one-layer coating or of a multilayer coating system.

Preferably, the wear-protection coating is made up of a one-layer coating of a ternary system.

A wear-protection coating is preferred made from a ternary Al-Me-N system, where Me is an element from the group of Ti, Zr, Hf, V, Nb, Ta, Cr, Mo, W, Si, and C, and Al signifies aluminum and N nitrogen.

An especially preferred ternary system consists of Cr—Al—N.

The wear-protection coating can also be made of a periodic-design, multilayer coating system, in which each periodicity consists of at least two individual layers which differ with regard to their composition. Preferably, the multilayer coating system exhibits individual layers of AlN and of a nitride of the group of Ti, Zr, Hf, V, Nb, Ta, Cr, Mo, W, Si, and C.

Preferably, each periodicity exhibits at least one individual layer of AlN. A periodicity is preferable made up of two individual layers, one individual layer of which consists of AlN.

Preferably, at least one individual layer consists of a nitride of at least two of the metals from the group mentioned.

Within the scope of such multilayer coating systems, multilayer coating systems are preferred with individual layers of CrN and AlN. Multilayer coating systems made up of individual layers with chromium nitride and aluminum nitride even exhibit thermal conductivities of 225 W/(m·K).

The thickness of an individual layer of such a multilayer coating system is preferably >15 nm to 1 μm.

Preferably, the thickness of an individual layer of the multilayer coating system is ≥2 nm to 15 nm. With such a small thickness, so-called superlattice structures result. Superlattice structures arise due to the distorted lattice arrangement in immediate proximity to the lattice of the adjacent individual layer. The individual layers are affected in the boundary region such that the lattice parameters there are altered. Due to the relatively great thickness of the individual layers, which are formed, for example, by 7 to 35 atomic layers, a core area occurs in each individual layer in which a lattice is formed, which corresponds to a one-layer coating. This core area is edged by a superlattice structure for the layer boundaries.

The total thickness of wear-protection coatings both in multilayer coating systems and in one-layer coatings is preferably ≥5 μm.

Preferred total thicknesses of wear-protection coatings are 5 to 60 μm, 5 to 15 μm, and 25 to 35 μm.

Disposed between the support material and the wear-protection coating, there is preferably an adhesive layer made of a metal or a nitride of the group mentioned above. Preferably, the adhesive layer consists of chromium.

Preferably, the wear-protection coating is applied by means of a PVD process, a reactive electric arc process, or a chemical vapor deposition (CVD) process.

Particular applications of these piston rings are provided for Otto motors and Diesel motors.

EXAMPLES

Determination of Thermal Conductivity in PVD Coatings

To measure thermal conductivity, the basic principle of the photo-acoustic method is used. Here, the PVD coating is exposed to the period radiation of light and temperature conductivity is measured.

The thermal conductivity of the specimen is calculated taking the density and the specific heat into consideration. The specific heat capacity in thin coatings corresponds to that of the solid material, but the density is not limited. For the evaluation, the density of the solid material is used.

| Coating | Thermal conductivity, in W/(m · K) |
| --- | --- |
| ECD - GDC ® | 34.8 ± 2.8 |
| ECD - Cr | 38.5 ± 3.1 |
| PVD - CrN | 170.4 ± 13.6 |
| PVD - CrN/AlN | 225.3 ± 18.2 |

ECD: galvanically deposited coating
GDC ®: chromium coating with diamond according to DE 19931829 A1

The thermal conductivity of typical CrN PVD-coatings is 170 W/(m·K). For PVD coatings, the thermal conductivity can differ from those of the solid material because these coatings are not constrained to be in thermal equilibrium and typically there is considerable residual stress.

The thermal conductivity of a multilayer coating system according to the invention with individual layers of CrN and AlN is 225.3 W/(m·K). This multilayer coating system exhibits no burn traces whatsoever.

The invention claimed is:

1. A piston ring made of a support material, the support material including a steel or cast material, and with a wear-protection coating forming the outermost surface of the coated piston ring, wherein the outermost surface of the wear protection coating faces away from the support material, wherein the wear-protection coating consists of a material with a thermal conductivity of at least 180 W/(m·K), wherein the wear-protection coating consists of a one layer coating made up of a ternary system, wherein the wear protection coating is made of a ternary Al-Me-N system with Me an element selected from a group consisting of Ti, Zr, Hf, V, Nb, Ta, Mo, W, Si, and C, in which Al signifies aluminum and N nitrogen.

2. A piston ring according to claim 1, wherein at least 5% vol. of the wear-protection coating, relative to the total wear-protection coating, consists of aluminum nitride.

3. A piston ring according to claim 2, wherein at least 10% vol. of the wear-protection coating, relative to the total wear-protection coating, consists of aluminum nitride.

4. A piston ring according to claim 2, wherein at least 20% vol. of the wear-protection coating, relative to the total wear-protection coating, consists of aluminum nitride.

5. A piston ring according to claim 2, wherein at least 30% vol. of the wear-protection coating, relative to the total wear-protection coating, consists of aluminum nitride.

6. A piston ring according to claim 2, wherein at least 40% vol. of the wear-protection coating, relative to the total wear-protection coating, consists of aluminum nitride.

7. A piston ring according to claim 2, wherein at least 50% vol. of the wear-protection coating, relative to the total wear-protection coating, consists of aluminum nitride.

8. A piston ring according to claim 1, wherein between the support material and the wear-protection coating is disposed an adhesive layer made of a metal or a nitride of a group Ti, Zr, Hf, V, Nb, Ta, Cr, Mo, W, Si, and C.

9. A piston ring according to claim 8, wherein the adhesive layer consists of Cr.

10. A piston ring according to claim 1, wherein the wear-protection coating is applied by means of a PVD process.

11. A piston ring according to claim 1, wherein the wear-protection coating is applied by means of a reactive electric arc process.

12. A piston ring according to claim 1, wherein the wear-protection coating is applied by means of a CVD process.

13. A piston ring made of a support material, the support material including a steel or cast material and with a wear-protection coating forming the outermost surface of the coated piston ring, wherein the outermost surface of the wear-protection coating faces away from the support material, wherein the wear-protection coating consists of a material with a thermal conductivity of at least 180 W/(m·K), wherein the wear protection coating consists of a periodic-design, multilayer coating system in which each periodicity consists of at least two individual layers which differ with respect to their composition.

14. A piston ring according to claim 1, wherein the wear-protection coating is disposed directly on the support material without another layer therebetween.

15. A piston ring according to claim 13, wherein the wear-protection coating system exhibits individual layers of AlN and of a nitride of a group Ti, Zr, Hf, V, Nb, Ta, Cr, Mo, W, Si, and C.

16. A piston ring according to claim 15, wherein at least one individual layer consists of a nitride of at least two metals from the group.

17. A piston ring according to claim 15, wherein the multilayer coating system exhibits individual layers of CrN and of AlN.

18. A piston ring according to claim 13, wherein the thickness of an individual layer in the multilayer coating system is >15 nm to 1 μm.

19. A piston ring according to claim 13, wherein the thickness of an individual layer in the multilayer coating system is >2 to 15 nm.

20. A piston ring according to claim 13, wherein the thickness of the multilayer coating system is >5 μm.

21. A piston ring according to claim 13, wherein the total thickness of the wear-protection coating is 5 to 60 μm.

22. A piston ring according to claim 13, wherein the total thickness of the wear-protection coating is 5 to 15 μm.

23. A piston ring according to claim 13, wherein the total thickness of the wear-protection coating is 25 to 35 μm.

\* \* \* \* \*